United States Patent
Chi et al.

(10) Patent No.: US 6,225,220 B1
(45) Date of Patent: May 1, 2001

(54) PLUG FORMING METHOD FOR SEMICONDUCTOR DEVICE

(75) Inventors: Sung-Hun Chi, Seoul; Jae-Hee Ha, Cheongju, both of (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/071,745

(22) Filed: May 4, 1998

(30) Foreign Application Priority Data

Jan. 14, 1998 (KR) .......................................... 98-818

(51) Int. Cl.[7] .................................................. H01L 21/44
(52) U.S. Cl. ......................... 438/672; 438/675; 438/629; 438/647; 438/719; 438/712; 438/711
(58) Field of Search ..................... 438/672, 647, 438/695, 697, 733, 738, 667, 711–712, 719, 657, 675, 629

(56) References Cited

U.S. PATENT DOCUMENTS

| | | | |
|---|---|---|---|
| 4,737,235 | | 4/1988 | Scannell ............................... 156/643 |
| 5,117,271 | * | 5/1992 | Comfort et al. ........................ 357/34 |
| 5,210,049 | * | 5/1993 | Anagnostopoulos .................... 438/60 |
| 5,441,907 | * | 8/1995 | Sung et al. ............................ 438/237 |
| 5,527,723 | * | 6/1996 | Witek et al. .......................... 438/212 |
| 5,607,875 | * | 3/1997 | Nishizawa et al. .................... 438/404 |
| 5,643,819 | * | 7/1997 | Tseng .................................... 438/396 |
| 5,904,566 | * | 5/1999 | Tao et al. .............................. 438/689 |
| 5,920,799 | * | 7/1999 | Graves et al. ........................ 438/798 |
| 5,962,903 | * | 10/1999 | Sung et al. ............................ 257/390 |

OTHER PUBLICATIONS

Wolf "Silicon Processing for the VLSI Era" vol. 1, p. 175, 1989.*

* cited by examiner

Primary Examiner—Chandra Chaudhari
Assistant Examiner—Thanh Nguyen
(74) Attorney, Agent, or Firm—Fleshner & Kim, LLP

(57) ABSTRACT

A plug forming method for a semiconductor device includes the steps of forming an insulation layer in a semiconductor substrate, forming an opening on a predetermined surface portion of the semiconductor substrate, forming a polysilicon layer on the insulation layer including the opening, and etching back the polysilicon layer using a compound gas mixed by a first gas including fluorine, and a second gas including one selected from nitrogen and oxygen. The method decreases the etching loading effect and the plug loss, thereby improving the reliability of the semiconductor device.

11 Claims, 4 Drawing Sheets

PLUG FORMING METHOD FOR SEMICONDUCTOR DEVICE

BACKGROUND OF THE INVENTION

1. Field of the Invention

The present invention relates to a interconnect for semiconductor device, and more particularly to an improved plug forming method for a semiconductor device wherein a plug of polysilicon material is formed in a contact hole.

2. Description of the Background Art

As accompanied by a large integration of a semiconductor device, a bit line contact hole and a node contact hole for a capacitor are significantly being decreased in size, thereby increasing an aspect ratio of a contact hole. Accordingly, when an interconnection is formed in a subsequent step, a polysilicon plug or a cylinder is formed inside a contact hole to prevent a short of the interconnection, and then a conductive interconnection is formed on the polysilicon plug or the cylinder according to a generalized interconnection forming method.

A plug forming method for a semiconductor device according to the background art will now be described.

As shown in FIG. 1, the semiconductor device for forming a plug according to the background art includes a semiconductor substrate 1 having a plurality of diffusion region 2 in the surface of the semiconductor substrate 1. An insulation layer 3 is formed on the semiconductor substrate 1, and the insulation layer 3 is partially etched over a diffusion region 2 formed in the semiconductor substrate 1 to form contact holes 4a, 4b or openings. Here, contact hole 4a is narrower in width than the contact hole 4b.

FIG. 2 is a cross-sectional view of a semiconductor device in which a polysilicon layer 5 is deposited on the structure of FIG. 1.

Referring to FIG. 3A, the polysilicon layer 5 of FIG. 2 is etched back to obtain plugs 5a, 5b or cylinders in the contact holes 4a, 4b. The etchback step employs an anisotropic etching method in which there is used a fluorine based plasma including a fluorine-containing gas such as $SF_6$, $CF_4$, and $CHF_3$, or a compound gas mixed by the fluorine-containing gas and a $Cl_2$. As shown in FIG. 3A, although the surface of the insulation layer 3 is smooth, there remain residues 6 formed of polymer. Also, the respective upper surfaces of the polysilicon plugs 5a, 5b is much lower in level than the upper surface of the insulation layer 3. Here, it is referred to as a plug loss that the upper surface of the plug is partially etched and removed to become lower than the upper surface of the insulation layer 3. Also, it should be understood that such a plug loss occurs more seriously in the polysilicon plug 5a formed in the relatively narrow contact hole 4a than in the polysilicon plug 5b formed in the relatively wide contact hole 4b. The loss difference between the plugs 5a, 5b occurs due to a loading effect during the etching step. In other words, the loading effect denotes that the smaller the etching target area, the more increased becomes the concentration of the etchant species, thereby increasing the etching steed.

As shown in FIG. 3B illustrating a cross-sectional view of a semiconductor device wherein a compound gas plasma mixed by a chlorine-containing gas such as $Cl_2$ and HCl, and a hydrogen bromide (HBr) and wherein the polysilicon plugs 5a, 5b or cylinders are formed. Therein, the surface of the insulation layer 3 is significantly rough and there is shown a plug loss.

After the etchback step as shown in FIGS. 3A, 3B, there is carried out a wet etching step to remove the residues 6 remaining along the entire structure on the semiconductor substrate 1.

As shown in FIG. 3A, when the polysilicon plug is formed using a conventional fluorine gas plasma, there is an advantage in that a smooth surface of the insulation layer is obtained. However, it is a disadvantage in that there occurs a serious plug loss as well as a critical loading effect.

Meanwhile, as shown in FIG. 3B, when there is employed a chlorine gas plasma, although the plug loss is not so critical, the loading effect becomes large. Further, the surface of the insulation layer disadvantageously becomes rough after the etchback step. When the surface of the insulation layer becomes rough, since the residues remain in the eaten-up surface of the insulation layer, the subsequent steps may cause a short effect to the interconnection, thereby deteriorating the reliability of the semiconductor device.

Further, when the HBr gas is added to the chlorine gas, although the roughness of the surface is more or less improved, the steps may be difficult for their reproducing.

SUMMARY OF THE INVENTION

The present invention is devised to solve the above-described disadvantages. Accordingly, it is an object of the present invention to provide a plug forming method for a semiconductor device for forming the upper surface of a polysilicon plug in a flat type without a curvature, and making smooth the respective upper surfaces of an insulation layer and plug, thereby improving the reliability of the semiconductor device.

It is another object of the present invention to provide a plug forming method for a semiconductor device which employs an etchback step for decreasing a loading effect by etching the polysilicon layer in a fast, even etching speed.

It is still another object of the present invention to provide a plug forming method for a semiconductor device which employs a polysilicon etchback step for decreasing a polysilicon plug loss by less than 300 Å.

It is also another object of the present invention to provide a plug forming method for a semiconductor device which employs an etchback step wherein an etching speed ratio of a polysilicon and an insulation layer is 5:1 and less than 5:1 by controlling a source power of a power discharge unit to generate plasma of an etching device.

To achieve the above-described objects, there is provided a plug forming method according to the present invention which includes the steps of forming an insulation layer on a semiconductor substrate, forming an opening on a predetermined surface portion of the semiconductor substrate, forming a polysilicon layer on the insulation layer including the opening, and etching back the polysilicon layer using a compound gas mixed by a first gas including fluorine, and a second gas including one selected from nitrogen and oxygen.

The objects and advantages of the present invention will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
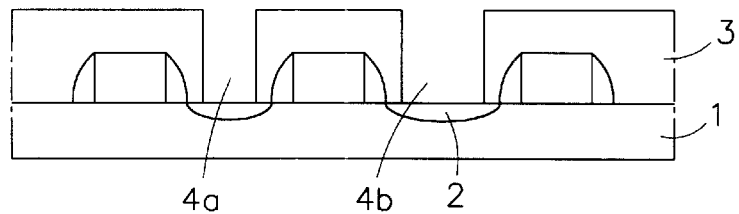
FIGS. 1 through 3B are cross-sectional process views with regard to an interconnection formation of a semiconductor device according to the background art.
Figure 2:
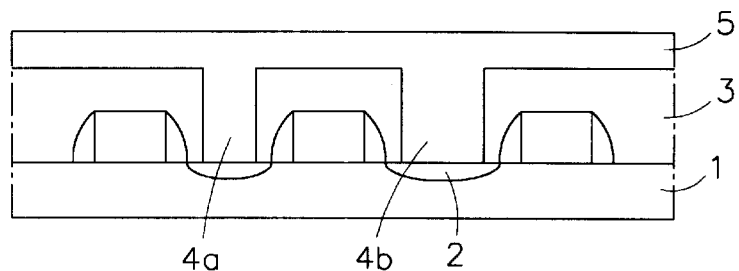
Figure 3A:
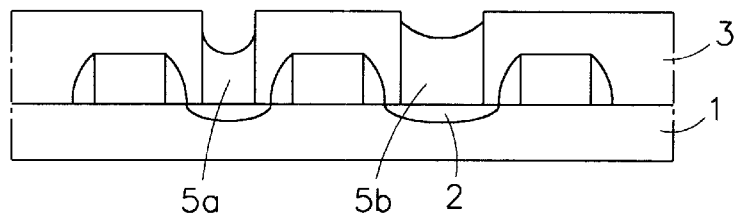
Figure 3B:
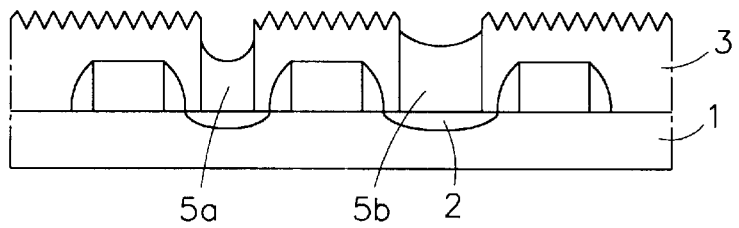

With reference to the accompanying drawings, the plug forming method for a semiconductor device will now be described.

As shown in FIG. 4A, on a semiconductor substrate 1 having a plurality of impurity region 2 there is formed an insulation layer 3. The insulation layer 3 is partially etched over the impurity region 2 formed in the semiconductor substrate 1 to form contact holes 4a, 4b or openings. Here, contact hole 4a is narrower in width than the contact hole 4b. Also, there is used an undoped silicate glass (USG) as an insulation layer.

Figure 4:
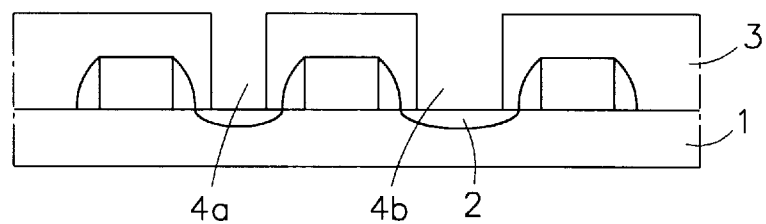
FIGS. 4 through 7 are cross-sectional process views with regard to an interconnection formation of a semiconductor device according to the present invention.
Figure 5:
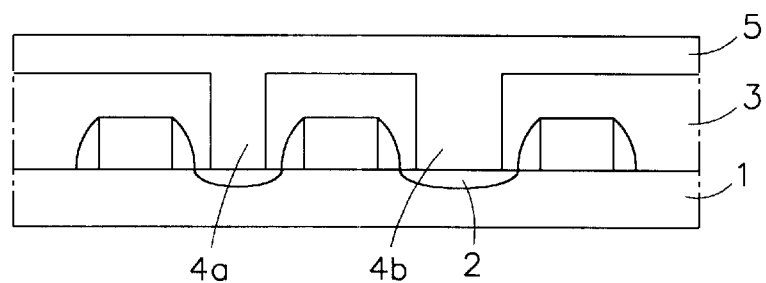

Then, as shown in FIG. 5, the contact holes 4a, 4b are simultaneously filled with doped or undoped polysilicon material and at the same time the doped or undoped polysilicon layer 5 is formed on the entire structure of FIG. 4.

Figure 6:
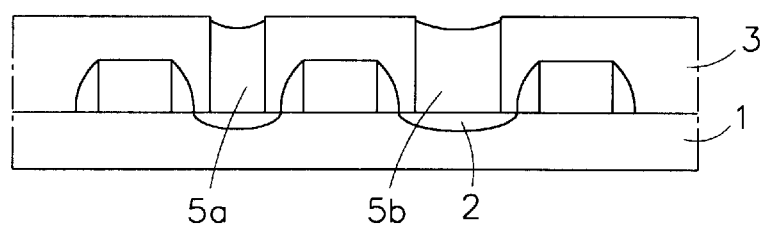
Figure 7:
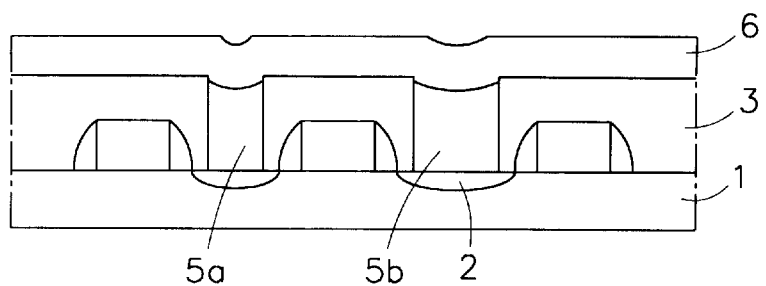

The polysilicon layer 5 is etched back to form polysilicon plugs 5a, 5b as shown in FIG. 6. As shown in FIG. 5, the upper surface of the insulation layer 4 is smooth, so that the plugs 5a, 5b show small loss and small loading effect. Here, the loss of the plugs 5a, 5b is less than 300 Å. Then, a conductive film 7 is formed on the entire upper surface of the structure of FIG. 6.

The etchback process will now be explained.

The semiconductor substrate 1 as shown in FIG. 6 is placed in a vacuum chamber serving as an etching apparatus. Here, it is preferred to select an etching device from a reactive ion etcher (RIE), a magnetically enhanced reactive ion etcher (MERIE), and a high density plasma etcher, so as to control an ion energy and a plasma density.

Then, into the vacuum chamber there are introduced a first gas including fluorine such as $SF_6$, $NF_3$, and a second gas serving as a compound gas including an oxygen or nitrogen such as $N_2$, $O_2$, NO, $SO_2$, $N_2O$, He—$O_2$. A plasma discharge is induced by supplying a source power of 200~300 W through a side electrode thereof in the vacuum chamber, and a bias power is added to another side electrode thereof for thereby executing an anisotropic etching.

According to the etching by use of the compound gas plasma, on the surface of the polysilicon plug there is formed a protection layer formed of a material such as Si—N or Si—O, so that the plug loss caused due to the fluorine ions is prevented by relieving the etching speed of the polysilicon plug. Also, when etched under the above condition, the plug loss and the loading effect are significantly decreased.

The operation of the plug forming method according to the present invention will now be described.

In order to decrease the polysilicon plug loss and the loading effect, the difference between etching speeds of the polysilicon layer and the oxide layer should be decreased. That is, as shown in FIG. 6, when the polysilicon layer 5 is etched to expose the insulation layer 3, if the etching speed ratio of the polysilicon layer 5 and the insulation layer 3 is identical or similar, the increase of etchant species with regard to either pattern of the polysilicon layer 5 and the insulation layer 3 is prevented to thus etch an even thickness thereof, thereby decreasing the loading effect. Also, as the polysilicon layer 5 and the insulation layer 3 are evenly etched, the surfaces thereof become flat, thereby preventing the plus loss. In order to restrain the plug loss and the loading effect, an etchback process should be carried out under a condition of less than 5:1 in etching ratio of the polysilicon layer 5 and the insulation layer 3. At this time, the plug loss is less than 300 Å, thereby forming polysilicon plugs 5a, 5b having decreased loading effects.

According to several experiments showing a small plug loss and decreased loading effect in plug formation.

Figure 8A:
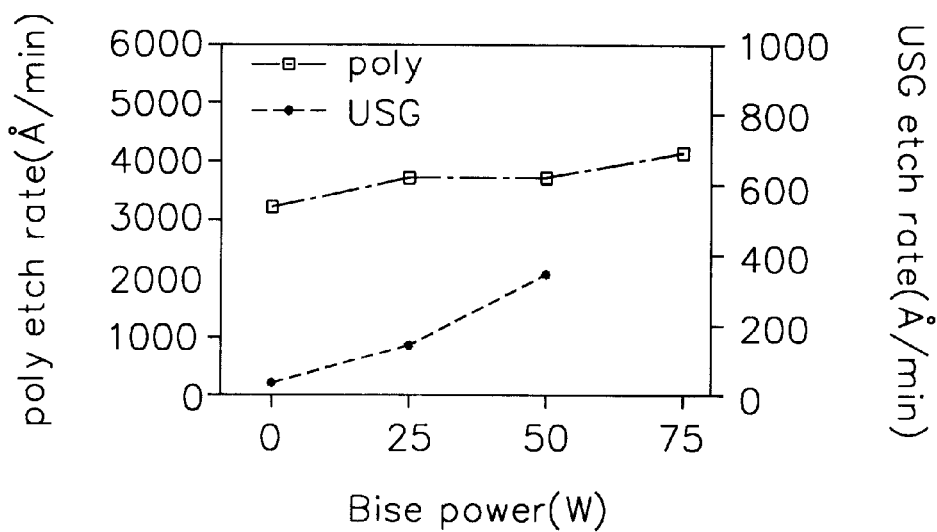
FIG. 8A is a graph comparing respective etching speeds of a polysilicon layer and an insulation layer in accordance with an increase of a bias power when an $SF_6$ gas is employed.

FIG. 8A is a graph illustrating an increase of an etching speed ratio of the polysilicon layer and the oxide layer serving as an insulation layer in accordance with the bias power increase when the only $SF_6$ gas is employed. As shown therein, as the bias power is increased, the etching speed of the polysilicon layer is gradually increased, whereas the etching speed of the oxide layer is increased in a larger pace. As a result, the larger the bias power, the more decreased becomes the selectivity of the polysilicon layer and the oxide layer. In particular, the etching selectivity becomes smallest at more than 20 W in bias power.

Figure 8B:
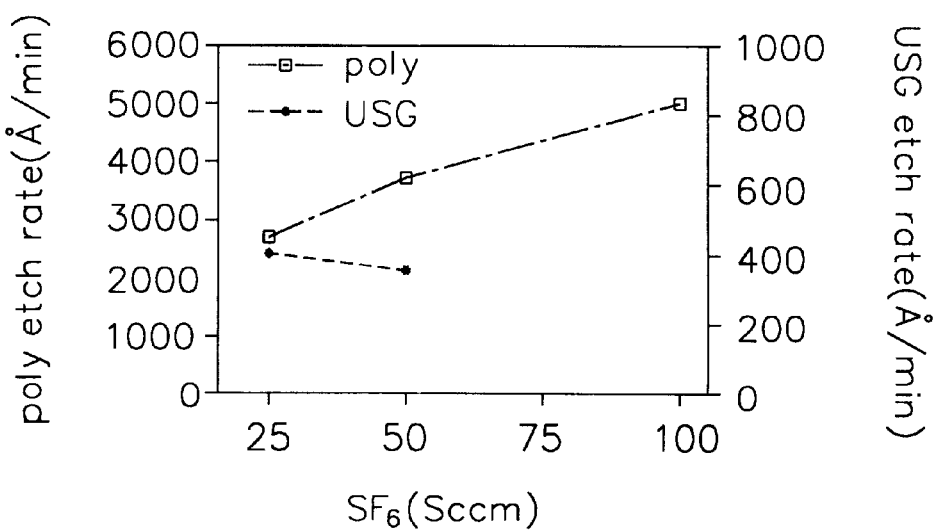
FIG. 8B is a graph comparing respective etching speeds of a polysilicon layer and an insulation layer in accordance with an increased flow of an $SF_6$ gas.

Also, as shown in FIG. 8B, when only $SF_6$ is used for the etching, the etching rate of the polysilicon is increased in proportion to the flow increase of $SF_6$. Meanwhile, the etching speed of the oxide layer serving as an insulation layer tends to be slightly decreased. That is, the etching selectivity is increased to a ratio of 10:1. Accordingly, the minimized flow of $SF_6$ causes the etching selectivity to be appropriately decreased to satisfy the object of the present invention.

Figure 9:
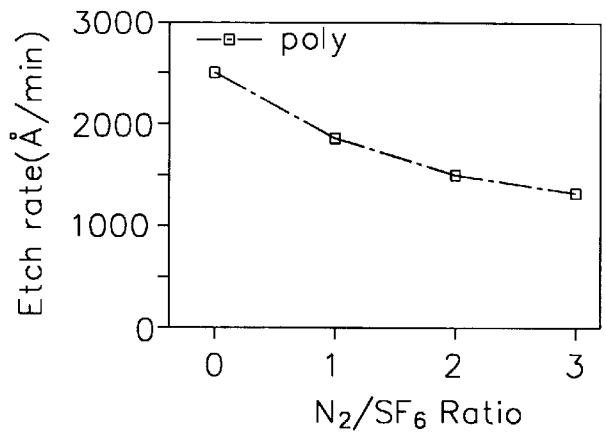
FIG. 9 is a graph illustrating an etching speed of a polysilicon layer in accordance with an increased compound ratio of an $N_2/SF_6$ gas.

FIG. 9 is a graph illustrating an etching steed of a polysilicon layer when an $N_2$ gas is added to an $SF_6$ gas. That is, when the compound gas ratio of $SF_6$ gas and $N_2$ gas is raised, the etching speed of the polysilicon layer is decreased. Also, it is known that the etching speed is decreased by forming an S—N protection layer on the surface of the polysilicon layer. Therefore, in order to lower the etching selectivity of the polysilicon layer and the oxide layer, the compound amount of $N_2$ gas should be increased.

Figure 10:
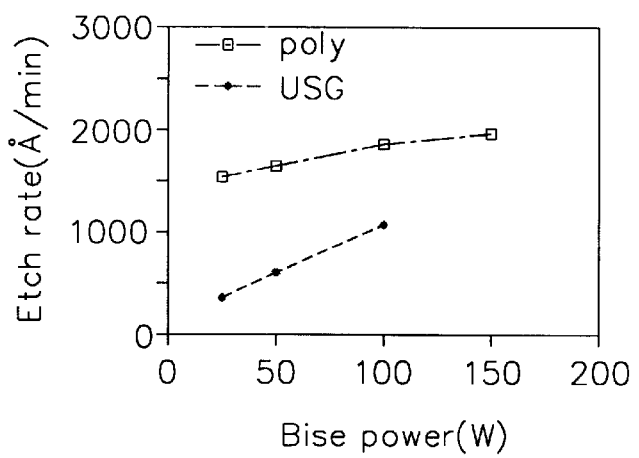
FIG. 10 is a graph illustrating respective etching speeds of a polysilicon layer and an oxide layer in accordance with an increase of a bias power when an $N_2/SF_6$ compound gas is employed.

FIG. 10 is a graph comparing respective etching speeds of the polysilicon layer and the oxide layer serving as insulation layer in accordance with the increase of the bias power applied to another side electrode of the device when the $SF_6/N_2$ compound gas plasma is used for the etching. As shown therein, the higher the bias power, the lower becomes the etching selectivity. In order to maintain the etching selectivity less than 5:1 in ratio, the bias power should be at more than 50 W, and preferably the etching should be carried out at more than 100 W.

Figure 11:
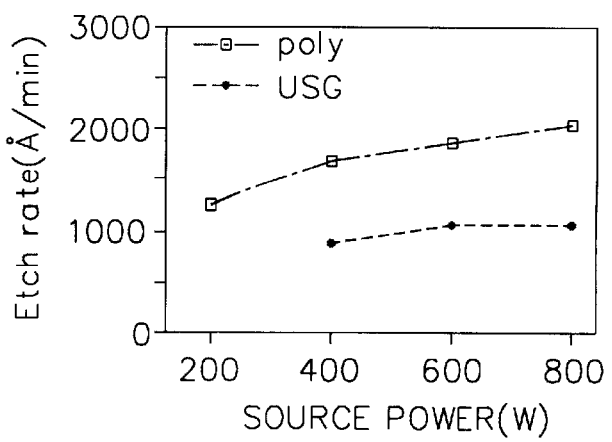
FIG. 11 is a graph illustrating respective etching speeds of a polysilicon layer and an oxide layer in accordance with an increase of a source power when an $N_2/SF_6$ compound gas is employed.

FIG. 11 is a graph comparing respective etching speeds of the polysilicon layer and the oxide layer serving as the insulation layer in accordance with the increase of the source power applied to a side electrode of the device when the $SF_6/N_2$ compound gas plasma is used for the etching. As shown therein, the etching selectivity is lowest in the source power range of 400~600 W. Here, when the etching is carried out in the range of 200~3000 W, the etching selectivity of the polysilicon layer and the oxide layer may be lowered less than 5:1 in ratio.

Through the above experiments, a compound gas mixed by adding a second gas selected from $N_2$, $O_2$, NO, $SO_2$, $N_2O$ to a first gas including fluorine such as $SF_6$ is employed for the etching gas. Here, the etching selectivity is lowest when the etchback process is carried out in a bias power of 50 W and a source power of 200 W. Also, the most desired etching selectivity ranges from 2.5:1~1.5:1. The etching loading effect is smallest in the ratio of less than 5:1. As a result, the interconnections for a semiconductor device cause the plug and the insulation layer to have flat surfaces.

As described above, the plug forming method for a semiconductor device according to the present invention decreases the etching loading effect and the plug loss, thereby improving the reliability of the semiconductor device.

Further, in the plug forming method according to the present invention there are not leftover residues after the etching precess and accordingly an additional refining or washing process is not required, thereby substantially improving productivity at the semiconductor device fabrication.

What is claimed is:

1. A plug forming method for a semiconductor device, comprising the steps of:

forming an insulation layer in a semiconductor substrate;

forming an opening on a surface portion of the semiconductor substrate;

forming a polysilicon layer on the insulation layer including the opening; and etching back the polysilicon layer using a compound gas consisting of a first gas $SF_6$, and a second gas $SO_2$ to form the plug.

2. The plug forming method of claim 1, wherein the insulation layer is an oxide layer.

3. The plug forming method of claim 1, wherein the insulation layer is an undoped silicate glass (USG).

4. The plug forming method of claim 1, wherein the polysilicon layer is an undoped polysilicon layer.

5. The plug forming method of claim 1, wherein the polysilicon layer is a doped polysilicon layer.

6. The plug forming method of claim 1, wherein a compound ratio of the first gas and the second gas is more than one to three (1:3).

7. The plug forming method of claim 1, wherein an etching device for the etching-back step is one selected from a reactive ion etcher (RIE), a magnetically enhanced reactive ion etcher (MERIE), and a high density plasma etcher which are capable of controlling an ion energy and density.

8. The plug forming method of claim 1, wherein an etching selectivity of the polysilicon layer and the insulation layer is less than five to one (5:1) in ratio.

9. The plug forming method of claim 8, wherein a source power applied to a side electrode of the etching device ranges from 200~3000 W.

10. The plug forming method of claim 8, wherein a bias power applied to another side electrode of the etching device is more than 50 W.

11. The plug forming method of claim 8, wherein a source power applied to a side electrode of the etching device ranges from 200~3000 W, and a bias power applied to another side electrode of the etching device is more than 50 W.

* * * * *